United States Patent
Schultz et al.

(10) Patent No.: US 7,442,932 B2
(45) Date of Patent: Oct. 28, 2008

(54) HIGH TEMPERATURE IMAGING DEVICE

(75) Inventors: Roger L. Schultz, Aubrey, TX (US);
James J. Freeman, Houston, TX (US);
Neal G. Skinner, Lewisville, TX (US);
Steven G. Streich, Duncan, OK (US)

(73) Assignee: Halliburton Energy Services, Inc., Houston, TX (US)

( * ) Notice: Subject to any disclaimer, the term of this patent is extended or adjusted under 35 U.S.C. 154(b) by 278 days.

(21) Appl. No.: 10/992,557

(22) Filed: Nov. 18, 2004

(65) Prior Publication Data
US 2005/0103980 A1 May 19, 2005

Related U.S. Application Data

(60) Provisional application No. 60/520,950, filed on Nov. 18, 2003.

(51) Int. Cl.
*G01J 5/00* (2006.01)
(52) U.S. Cl. .............. 250/338.1; 250/338.02
(58) Field of Classification Search .......... 250/208.1, 250/257–258, 261–264, 255, 256, 338.1–338.4, 250/339.01–339.02, 339.04, 339.06; 356/121
See application file for complete search history.

(56) References Cited

U.S. PATENT DOCUMENTS

| | | | |
|---|---|---|---|
| 4,053,916 A | 10/1977 | Cricchi et al. | |
| 4,084,190 A * | 4/1978 | Stein | 348/302 |
| 4,100,672 A * | 7/1978 | King et al. | 438/60 |
| 4,185,293 A * | 1/1980 | Tihanyi | 348/302 |
| 4,376,984 A | 3/1983 | Fukushima et al. | |
| 4,461,956 A * | 7/1984 | Hatanaka et al. | 358/482 |
| 4,724,530 A | 2/1988 | Dingwall | |
| 4,803,178 A | 2/1989 | McCaughan | |
| 4,922,315 A | 5/1990 | Vu | |
| 5,041,975 A | 8/1991 | Minerbo et al. | |
| 5,146,299 A | 9/1992 | Lampe et al. | |
| 5,289,017 A * | 2/1994 | Nii | 257/77 |
| 5,374,567 A | 12/1994 | Cartagena | |
| 5,416,043 A | 5/1995 | Burgener et al. | |
| 5,436,442 A * | 7/1995 | Michon et al. | 250/208.1 |
| 5,541,432 A | 7/1996 | Tsuji | |
| 5,610,331 A * | 3/1997 | Georgi | 73/152.18 |
| 5,627,092 A | 5/1997 | Alsmeier et al. | |
| 5,670,009 A * | 9/1997 | Tarn et al. | 156/299 |
| 5,828,797 A * | 10/1998 | Minott et al. | 385/12 |
| 5,869,868 A | 2/1999 | Rajeevakumar | |

(Continued)

FOREIGN PATENT DOCUMENTS

WO    WO 03/096073 A1    11/2003

*Primary Examiner*—Georgia Y. Epps
*Assistant Examiner*—Kevin Wyatt
(74) *Attorney, Agent, or Firm*—Krueger Iselin LLP; Daniel J. Krueger

(57) ABSTRACT

High temperature imaging devices are disclosed. In one embodiment, the imaging device comprises an array of photosensitive elements fabricated on an insulator substrate, and an information storage component coupled to the array. The information storage component stores data representing one or more light patterns detected by the array. The light patterns may be images or spectral patterns. The insulator substrate may be a sapphire or spinel substrate. Alternatively, the substrate may be silicon carbide or an insulated silicon substrate. In at least some embodiments, a processor is integrated on the same substrate as the array.

29 Claims, 5 Drawing Sheets

U.S. PATENT DOCUMENTS

| | | |
|---|---|---|
| 5,991,602 A | 11/1999 | Sturm |
| 6,041,860 A * | 3/2000 | Nazzal et al. ............ 166/250.01 |
| 6,300,624 B1 * | 10/2001 | Yoo et al. .................... 250/254 |
| 6,424,011 B1 | 7/2002 | Assaderaghi et al. |
| 6,443,228 B1 | 9/2002 | Aronstam et al. |
| 6,472,702 B1 | 10/2002 | Shen |
| 6,627,954 B1 | 9/2003 | Seefeldt |
| 2001/0055838 A1 | 12/2001 | Walker et al. |
| 2002/0140010 A1 * | 10/2002 | Vu et al. ..................... 257/294 |
| 2002/0160711 A1 * | 10/2002 | Carlson et al. ................. 455/41 |
| 2003/0052701 A1 * | 3/2003 | Brown et al. ................. 324/752 |
| 2003/0176009 A1 * | 9/2003 | Rhodes ......................... 438/57 |
| 2003/0179601 A1 | 9/2003 | Seyyedy et al. |
| 2004/0007751 A1 | 1/2004 | Mattson |
| 2004/0041189 A1 | 3/2004 | Voshell et al. |
| 2005/0016770 A1 * | 1/2005 | Mayes .......................... 175/41 |
| 2005/0023656 A1 | 2/2005 | Leedy |
| 2006/0128071 A1 | 6/2006 | Rankin et al. |

* cited by examiner

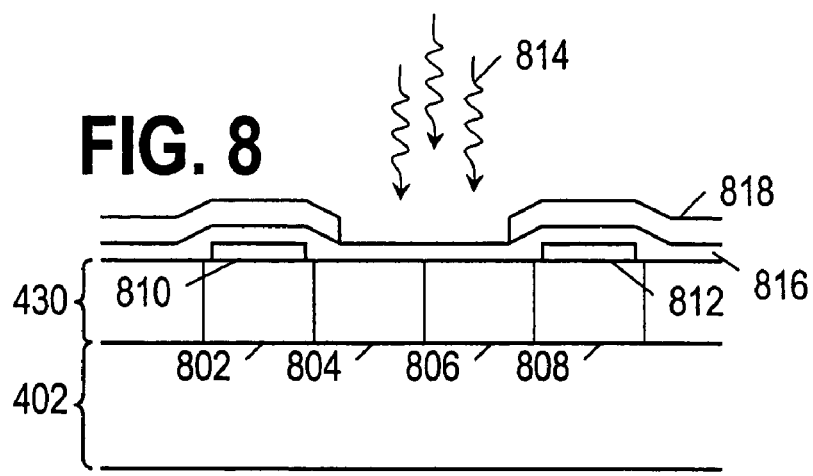
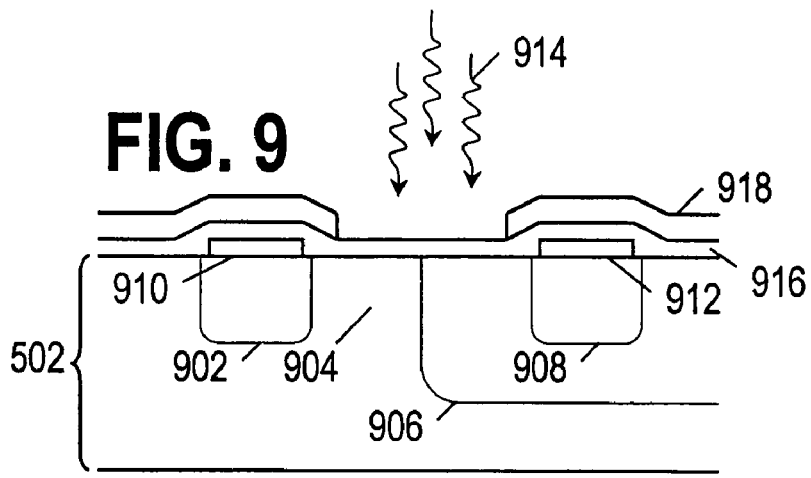
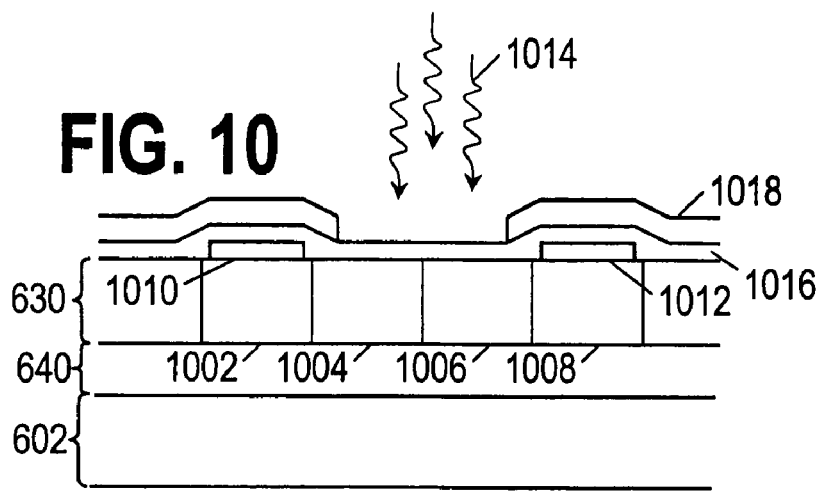

FIG. 11
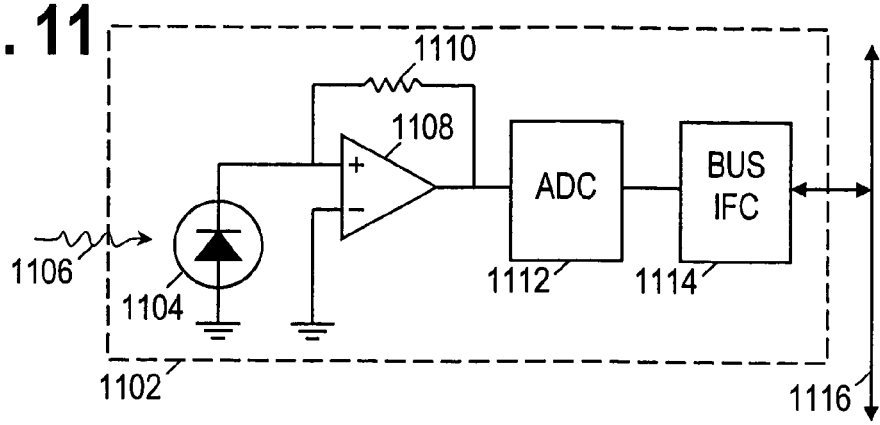
FIG. 12
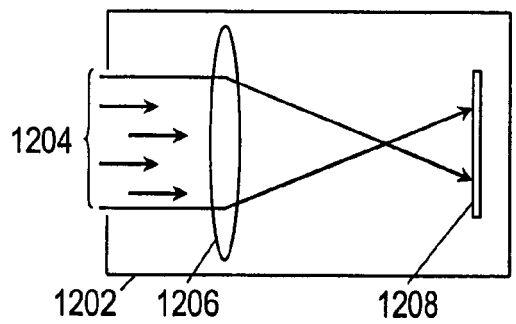
FIG. 13
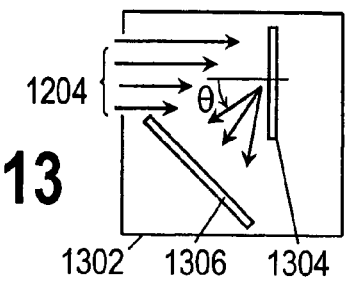
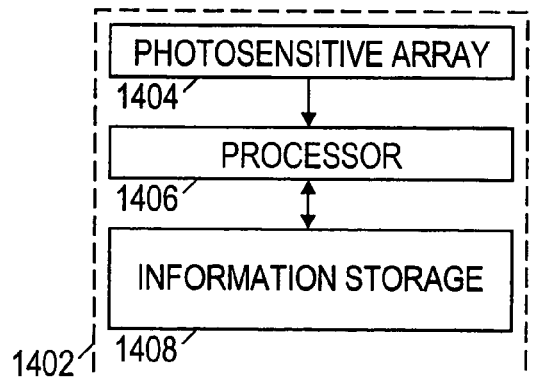
FIG. 14

HIGH TEMPERATURE IMAGING DEVICE

CROSS-REFERENCE TO RELATED APPLICATIONS

This application is a non-provisional application claiming priority to provisional application Ser. No. 60/520,992, filed on Nov. 18, 2003, entitled "High Temperature Electronics Suitable For Downhole Use," and provisional application Ser. No. 60/520,950, filed on Nov. 18, 2003, entitled "High Temperature SIC Electronics Suitable For Downhole Use, High Temperature SIC Circuits, And Receiver SIC Electronics Proximate Antenna," both of which are hereby incorporated by reference.

STATEMENT REGARDING FEDERALLY SPONSORED RESEARCH OR DEVELOPMENT

Not applicable.

BACKGROUND

Modern petroleum drilling and production operations demand a great quantity of information relating to parameters and conditions downhole. Such information typically includes characteristics of the earth formations traversed by the wellbore, along with data relating to the size and configuration of the borehole itself. The collection of information relating to conditions downhole, which commonly is referred to as "logging", can be performed by several methods.

In conventional oil well wireline logging, a probe (or "sonde") housing formation sensors is lowered into the borehole after some or all of the well has been drilled. The formation sensors are used to determine certain characteristics, such as conductivity and resistivity, of the formations traversed by the borehole. The upper end of the sonde is attached to a conductive wireline that suspends the sonde in the borehole. Power is transmitted to the sensors and instrumentation in the sonde through the conductive wireline. Similarly, the instrumentation in the sonde communicates information to the surface by transmitting electrical signals through the wireline.

An alternative method of logging is the collection of data during the drilling process. Collecting and processing data during the drilling process eliminates the necessity of removing ("tripping") the drilling assembly to insert a wireline logging device. It consequently allows the driller to make accurate modifications or corrections as needed to optimize performance while minimizing down time. Designs for measuring conditions downhole, including the movement and location of the drilling assembly contemporaneously with the drilling of the well, have come to be known as "measurement-while-drilling" techniques, or "MWD". Similar techniques, concentrating more on the measurement of formation parameters, commonly have been referred to as "logging while drilling" techniques, or "LWD". While distinctions between MWD and LWD may exist, the terms MWD and LWD often are used interchangeably. For the purposes of this disclosure, the term MWD will be used with the understanding that this term encompasses both the collection of formation parameters and the collection of information relating to the movement and position of the drilling assembly.

In both MWD and conventional wireline logging, as well as various other applications, the operating temperature experienced may be far in excess of normal surface conditions. Unfortunately, the operating temperature may exceed the specified ranges for some of the electrical components utilized in the downhole devices. Imaging devices that contain such components may operate unreliably in the downhole environment. Thus, what is needed in the art are imaging devices capable of operating reliably in high-temperature environments.

BRIEF DESCRIPTION OF THE DRAWINGS

In the following detailed description, reference will be made to the accompanying drawings in which:

FIG. 8 shows an illustrative physical structure for a photo diode using SOS technology;

FIG. 9 shows an illustrative physical structure for a photo diode using SiC technology;

FIG. 10 shows an illustrative physical structure for a photo diode using SOI technology;

FIG. 11 shows a pixel cell for an illustrative image sensitive device;

FIG. 12 shows an illustrative solid state camera;

FIG. 13 shows an illustrative spectrometer; and

FIG. 14 shows a block diagram of a high temperature imaging device.

The following description has broad application. Each disclosed embodiment with accompanying discussion is meant only to be illustrative of that embodiment, and is not intended to suggest that the scope of the disclosure, including the claims, is limited to that embodiment.

NOTATION AND NOMENCLATURE

Certain terms are used throughout the following description and claims to refer to particular system components. This document does not intend to distinguish between components that differ in name but not function.

In the following discussion and in the claims, the terms "including" and "comprising" are used in an open-ended fashion, and thus should be interpreted to mean "including, but not limited to . . . ". Also, the term "couple" or "couples" is intended to mean either an indirect or direct connection. Thus, if a first device couples to a second device, that connection may be through a direct connection or through an indirect electrical connection via other devices and connections.

DETAILED DESCRIPTION

High temperature imaging devices are disclosed herein. In one embodiment, the imaging device comprises an array of photosensitive elements fabricated on an insulator substrate, and an information storage component coupled to the array. The information storage component stores data representing one or more light patterns detected by the array. The light patterns may be images or spectral patterns. The insulator substrate may be a sapphire or spinel substrate. Alternatively, the substrate may be silicon carbide or an insulated silicon substrate. In at least some embodiments, a processor is integrated on the same substrate as the array.

Figure 1:
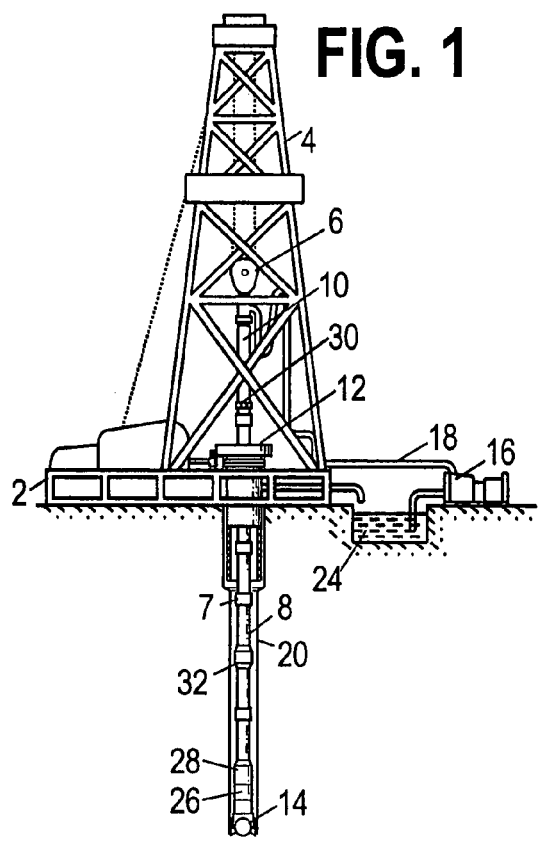
FIG. 1 shows a representative logging-while-drilling (LWD) configuration.

FIG. 1 shows an illustrative oil well during drilling operations. A drilling platform 2 is equipped with a derrick 4 that supports a hoist 6. Drilling of oil and gas wells is typically carried out with a string of drill pipes connected together by "tool" joints 7 so as to form a drill string 8. The hoist 6 suspends a kelly 10 that is used to lower the drill string 8 through rotary table 12. Connected to the lower end of the drill string 8 is a drill bit 14. The bit 14 is rotated by rotating the drill string 8 or by operating a downhole motor near the drill bit. The rotation of the bit 14 extends the borehole.

Drilling fluid is pumped by recirculation equipment 16 through supply pipe 18, through drilling kelly 10, and down through the drill string 8 at high pressures and volumes to emerge through nozzles or jets in the drill bit 14. The drilling fluid then travels back up the hole via the annulus between the exterior of the drill string 8 and the borehole wall 20, through the blowout preventer (not specifically shown), and into a mud pit 24 on the surface. On the surface, the drilling fluid is cleaned and then recirculated by recirculation equipment 16. The drilling fluid cools the drill bit 14, carries drill cuttings to the surface, and balances the hydrostatic pressure in the rock formations.

Downhole instrument sub 26 may be coupled to a telemetry transmitter 28 that communicates with the surface to provide telemetry signals and receive command signals. A surface transceiver 30 may be coupled to the kelly 10 to receive transmitted telemetry signals and to transmit command signals downhole. Alternatively, the surface transceiver may be coupled to another portion of the rigging or to drillstring 8. One or more repeater modules 32 may be provided along the drill string to receive and retransmit the telemetry and command signals. The surface transceiver 30 is coupled to a logging facility (not shown) that may gather, store, process, and analyze the telemetry information.

Figure 2:
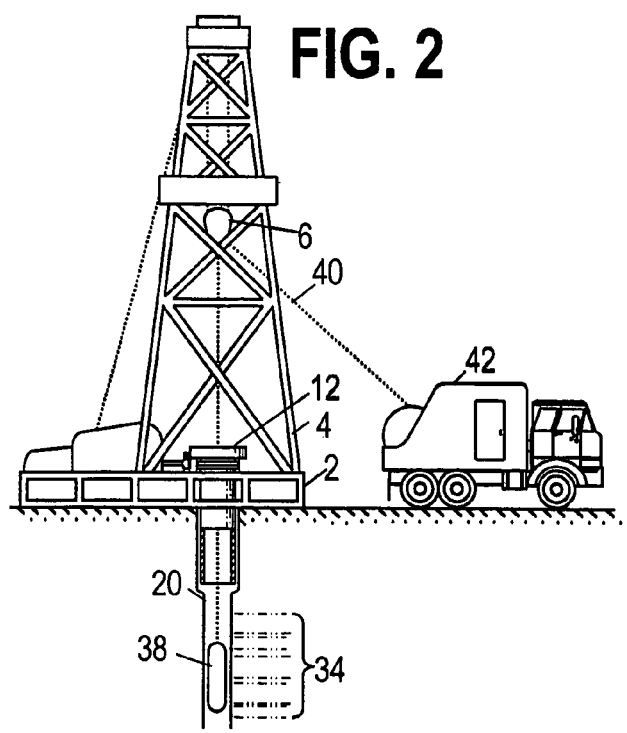
FIG. 2 shows a representative wireline-logging configuration.

FIG. 2 shows an illustrative well during wireline logging operations. The derrick 4 is not necessary for wireline logging, but is typically present throughout the drilling process. The drill string has been removed from the borehole to allow a sonde 38 to be lowered by wireline 40 into the well. Typically, the sonde 38 is lowered to the bottom of the region of interest and subsequently pulled upward at a constant speed. During the upward trip, the sonde 38 performs measurements on the formations 34 adjacent to the borehole as the sonde passes by. The measurement data are communicated to a logging facility 42 for storage, processing, and analysis. In another embodiment, the sonde may be attached to the end of a continuous tubing (CT) string and moved through the well bore by the coiled tubing.

During the wireline logging operations, the borehole may be filled with a fluid that balances the pressure in the formation and preserves the integrity of the borehole. A number of fluid types may be used, depending on considerations of cost, environment, and formation type. The fluids may be water-based or oil-based, and are generally formulated with weighting agents to customize the fluid density. Sometimes, however, the only fluid may be air (e.g., in hard-rock country).

The electronics employed in the downhole instrument sub 26 and in the sonde 38 are configured to operate at the elevated temperatures experienced downhole. Because the electronics are resident in the borehole for only a limited time, the electronics could be shielded from the elevated temperatures by insulation, heat-absorbing materials, and/or active refrigeration. These traditional approaches to configuring electronics for elevated temperature operation have been motivated by the poor performance of many electronics when they are directly exposed to environments with temperatures above 185 Celsius. However, these approaches greatly increase the size of the electronics package, and in the case of active refrigeration, greatly increase the energy consumption by the electronics package. Further, these approaches have not suggested a solution for providing electronics that can remain resident in a well indefinitely.

Though drilling and production have been specifically described above, other contexts for the use of downhole electronics also exist. For example, fluid injection, formation fracturing, seismic mapping, and long term monitoring are also appropriate contexts for the use of downhole electronics. The various tools that have been developed or proposed for application in these varied contexts satisfy different requirements, including among other things, high temperature operability, reliability, extended mission life, size limitations, power limitations, and robustness. Wireline tools typically run between 3 to 30 hours on each trip. Logging while drilling (LWD) tools typically run between 2 days to 2 weeks. Memory tools may be run from a few days to a few months. Permanently installed monitoring systems may operate from 3 years to 10 years or more. In each case, improving the suitability of the electronics for high-temperature operation will lengthen the mission life and extend the time period over which the tools can be reused without servicing. The suitability of the electronics for high-temperature operation will also benefit reliability and robustness, and may further reduce or eliminate space or power demands for refrigeration equipment.

It is desirable to provide electronic instruments and controls that may stay resident in wells indefinitely at elevated temperatures. In production wells, the electronics may sense fluid type, flow rate, pressure, temperature, and other parameters. Electronic controls may be provided to regulate flows from different regions of a formation, or to control artificial lift parameters such as the gas injection rate, fluid heating energy, or pumping rates. In test wells, the electronics may include seismic energy sensors for reservoir mapping and monitoring.

Figure 3:
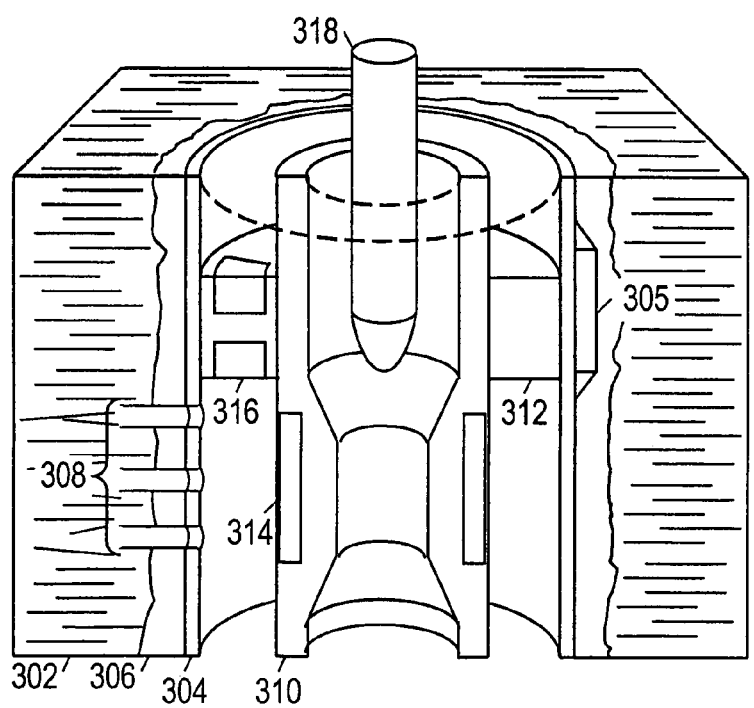
FIG. 3 shows a cut-away view of a production well.

FIG. 3 shows examples of electronics that may be disposed indefinitely in a well. A well in a formation 302 is lined with casing 304. The casing may include an instrument package 305 attached to its exterior. The casing is typically surrounded by cement 306. Perforations 308 in the casing and surrounding cement reach the formation and allow fluids to enter the well bore. A production tubing string placed in the casing may include an instrument sub 310 having an electronics package 314 located in thickened walls of the instrument sub. The annulus between the production tubing and the casing may be sealed by a packer 312 to isolate different portions of the well. The packer may include one or more electronics packages 316. A wireline sonde 318 or other probe may be inserted and possibly anchored indefinitely within the production tubing. Any of various forms of telemetry may be used to communicate with the surface, including but not limited to radio frequency communication, mud pulse telemetry, electrical transport over a wireline cable, and acoustic telemetry. Alternatively, data may be stored for later retrieval.

The need for cooling may be reduced or eliminated through the use of a different semiconductor technology. Transistors and other integrated circuit components are formed by placing differently-doped regions of silicon in contact with each other to create depletion regions. The traditional silicon integrated circuits are formed on the surface of a silicon wafer. Typically, the electrically active surface circuits are not separated from the semiconductive bulk of the silicon wafer. The contact of active device regions with the bulk material of the wafer causes the depletion regions to be much larger than would be strictly necessary to create an operable device. At normal operating temperatures, the size of the depletion regions is typically not an issue. However, as the device temperatures increase, thermally excited electrons create stray current carriers in the depletion regions. These stray current carriers cause a leakage current to flow to or from regions that are supposed to be isolated by these depletion regions. The leakage currents increase rapidly as a function of temperature, and at elevated temperatures, the leakage currents may be quite large. Large leakage currents are detrimental for a number of reasons. The leakage currents give rise to additional heat dissipation, which may further raise the temperature and thereby further increase leakage currents. Leakage currents will substantially increase the integrated circuit's power consumption. Leakage currents generally degrade the performance of integrated circuits, and at some temperature the circuits will be rendered inoperable. Finally, leakage currents increase the likelihood of unintentional and undesirable interaction between integrated circuit components. One example of a common interaction is the "latchup" effect, in which a current path with a runaway effect forms between neighboring transistors, leading to large currents that typically can only be stopped by removing power from the circuit.

Another environmental effect at elevated temperatures is enhanced electromigration. Electromigration is the movement of metal atoms caused by the flow of electrons. Electromigration can lead to the thinning and separation of interconnections within an integrated circuit. One form of protection against electromigration is to limit current densities. The integrated circuits may be designed to operate on lower currents (e.g., more slowly), or the interconnects may be designed with larger cross-sectional areas to reduce the current density.

Rather than relying on die from bulk silicon wafers to combat enhanced electromigration and leakage currents, integrated circuits may be formed on electrically insulating wafers. By separating the active device regions from the wafer bulk, the size of the depletion regions is greatly reduced, and the leakage currents are reduced correspondingly. Such insulated wafers may include bulk silicon wafers with an insulating layer between the circuitry and the bulk of the wafer substrate. However, in such insulated configurations, there are additional steps required to form and preserve the insulating layer during fabrication of the integrated circuits. Also, there remains in such configurations a capacitive coupling with the wafer bulk that affects power consumption and limits the integrated circuit's operating speed. For downhole and other applications, it may be preferred to use wafers of a bulk insulating material. For example, sapphire is an insulating material which may be formed into single-crystal wafers and provided with a semiconductor surface layer. Sapphire wafers with a thin silicon surface layer are commercially available. When patterned with suitably-designed devices, silicon-on-sapphire (SOS) wafers may be suitable for constructing electronics that perform well at elevated temperatures.

In addition to SOS wafers, integrated circuits may be formed on silicon carbide wafers. Silicon carbide has a larger energy band gap than silicon, making it much more difficult for thermally excited electrons to create stray current carriers. This relative immunity sharply reduces leakage currents in integrated circuits. When patterned with suitably-designed devices, silicon carbide (SiC) wafers may be suitable for constructing electronics that perform well at elevated temperatures.

Silicon-on-insulator (SOI) wafers use an insulating layer, such as silicon oxide, to separate the circuitry from the bulk of a semiconductor silicon wafer. (Other insulators, and indeed, other substrate wafers may be employed. However, silicon oxide on bulk silicon is currently the most inexpensive embodiment of SOI technology.) The insulating layer bonds to a crystal silicon layer, producing integrated circuits that operate well at elevated temperatures. Various techniques exist for producing SOI wafers. One such technique, referred to as separation by implantation of oxygen (SIMOX), injects purified oxygen into a silicon wafer at high temperatures to create a smooth layer of silicon oxide film that acts as an insulating layer. Another technique, referred to as back etched silicon on insulator (BESOI), uses a chemical etch to thin a layer of bulk silicon bonded to an insulating layer. Unlike SIMOX, BESOI layers reduce defects on the substrate side of the oxide layer.

Having discussed various device technologies that may be suitable for constructing a high-temperature imaging device, we turn now to components that may be suitable for implementing the high-temperature imaging device. Such components include a high-temperature digital memory, a high-temperature array of photosensitive elements, and support circuitry for capturing images and storing them in memory.

Figure 4:
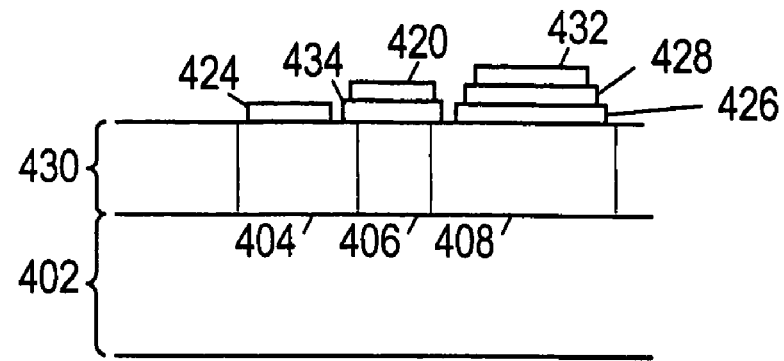
FIG. 4 shows an representative silicon-on-sapphire (SOS) implementation of a ferroelectric memory cell.

FIG. 4 shows an illustrative SOS implementation of a ferroelectric memory (FRAM) cell. A PMOS transistor is created out of n+, p, and n+ doped regions 404, 406, and 408, respectively, in a layer of silicon 430 on a sapphire substrate 402. When a voltage is applied to gate electrode 420, a conductive channel forms in active region 406, electrically coupling terminal electrode 424 to intermediate electrode 426. A ferroelectric layer 428 separates a terminal electrode 432 from intermediate electrode 426. An insulating oxide layer 434 separates the gate electrode 420 from the layer of silicon 430.

Figure 5:
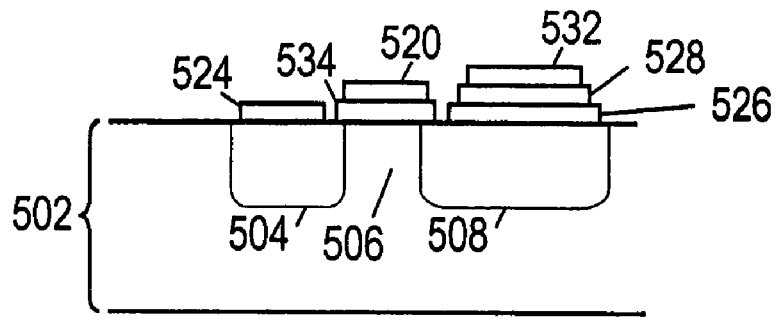
FIG. 5 shows an representative silicon carbide (SiC) implementation of a ferroelectric memory cell.

FIG. 5 shows an illustrative SiC implementation of a ferroelectric memory (FRAM) cell. A PMOS transistor is created out of n+, p, and n+ doped regions 504, 506, and 508, respectively, on a SiC substrate 502. When a voltage is applied to gate electrode 520, a conductive channel forms in active region 506, electrically coupling terminal electrode 524 to intermediate electrode 526. A ferroelectric layer 528 separates a terminal electrode 532 from intermediate electrode 526. An insulating oxide layer 534 separates the gate electrode 520 from the silicon carbide substrate 502.

Figure 6:
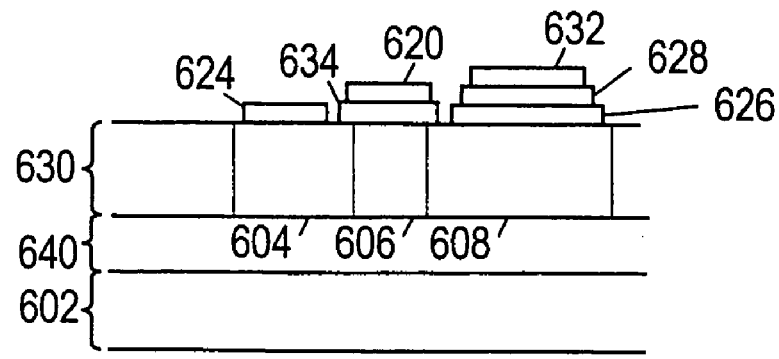
FIG. 6 shows an representative silicon-on-insulator (SOI) implementation of a ferroelectric memory cell.

FIG. 6 shows an illustrative SOI implementation of a ferroelectric memory (FRAM) cell. A PMOS transistor is created out of n+, p, and n+ doped regions 604, 606, and 608, respectively, in a layer of silicon 630 on top of an insulating oxide layer 640 and a silicon substrate 602. When a voltage is applied to gate electrode 620, a conductive channel forms in active region 606, electrically coupling terminal electrode 624 to intermediate electrode 626. A ferroelectric layer 628 separates a terminal electrode 632 from intermediate electrode 626. An insulating oxide layer 634 separates the gate electrode 620 from the layer of silicon 630.

The electrode/ferroelectric/electrode structures 426/428/432, 526/528/532, 626/628/632 (in FIGS. 4, 5, and 6, respectively) electrically behave much like a capacitor, with the following notable difference. When an electric field is applied to the ferroelectric layer, a "charge spike" will occur if the polarity is opposite the polarity of a previously-applied electric field. This difference allows the structure to be used as a bit memory. The polarity of an applied electric field "sets" the ferroelectric material to one of two possible states. The state can be later determined by the presence or absence of a charge spike when a subsequent electric field is applied. The read operation is destructive, so a re-write may be used to reset the state of the ferroelectric material.

Figure 7:
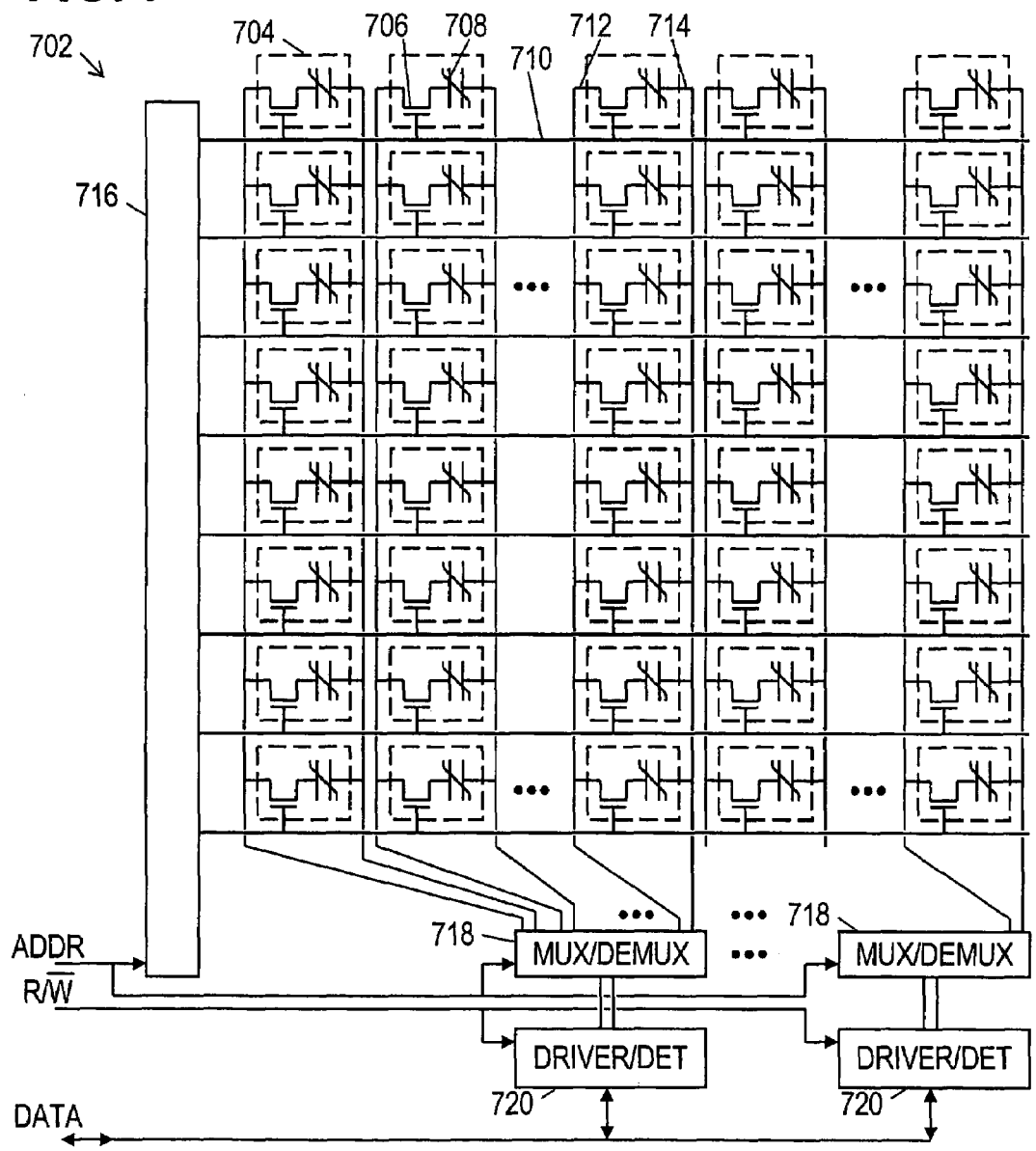
FIG. 7 shows a physical structure of an illustrative ferroelectric memory.

FIG. 7 shows a block diagram of an illustrative high-temperature ferroelectric memory 702 based on any of the memory cell implementations of FIGS. 4, 5, and 6. Memory 702 includes an array of ferroelectric memory cells 704 arranged in columns and rows. Each ferroelectric memory cell 704 includes an access transistor 706 and a ferroelectric memory element 708. The gate of each access transistor is coupled to one of multiple row lines 710. The terminal electrodes of the ferroelectric memory cell are coupled to one of multiple pairs of column lines 712, 714. A given ferroelectric memory cell may be accessed (read from or written to) by applying a voltage between the pair of column lines to which the cell is connected, and asserting the corresponding row line. Multiple memory cells from a given row may be accessed simultaneously.

Ferroelectric memory 702 receives an address signal ADDR, a read/write control signal, and a bidirectional data bus. A column decoder 716 receives a portion of a memory address ADDR and asserts a corresponding row line. Ferroelectric memory 702 further includes a set of column line pair multiplexers/demultiplexers (MUX/DEMUX) 718. Each MUX/DEMUX 718 receives the remaining portion of the memory address ADDR and couples the corresponding column line pair to a Driver/Detector circuit 720. For write operations, the driver/detector circuits 720 drive a voltage between the column line pair with a polarity that indicates the received data bit. For read operations, the driver/detector circuits 720 drive a predetermined voltage between the column line pair and measure the presence or absence of a charge spike. The presence or absence is decoded as a one or zero (or vice versa), and the detected data is provided on the data bus. If a charge spike is detected, the Driver/Detector circuit 1620 drives an opposite polarity across the column line pair to reset the ferroelectric memory element to its original state.

The support circuitry for ferroelectric memory 702 (namely, elements 716, 718, and 720) may be constructed using SOS, SiC, and/or SOI technology. (Any type of SOI technology, such as back-etched silicon on insulator (BESOI) and separation by implanted oxygen (SIMOX) may be employed.) Such construction may allow the memory to operate at higher temperatures than would be possible with support elements implemented in bulk silicon technology.

FIG. 8 shows a photoelectric diode implemented using SOS technology. The diode comprises regions of n+-doped silicon 802, n-doped silicon 804, p-doped silicon 806, and p+-doped silicon 808. The heavily doped regions 802 and 808 provide ohmic contacts for metal electrodes 810 and 812. A thin passivation layer (e.g., silicon dioxide) 816 allows light 814 to pass into the depletion region that forms between regions 804 and 806. A mask layer (e.g., a metal) 818 blocks light from reaching other electrical components and potentially interfering with their operation.

FIG. 9 shows a photoelectric diode implemented using SiC technology. The diode comprises regions of n+-doped silicon carbide 902, n-doped silicon carbide 904, p-doped silicon carbide 906 and p+-doped silicon carbide 908. The heavily doped regions 902 and 908 provide ohmic contacts for metal electrodes 910 and 912. A thin passivation layer (e.g., silicon dioxide) 916 allows light 914 to pass into the depletion region that forms between regions 904 and 906. A mask layer (e.g., a metal) 918 blocks light from reaching other electrical components and potentially interfering with their operation.

FIG. 10 shows a photoelectric diode implemented using SOI technology. The diode comprises regions of n+-doped silicon 1002, n-doped silicon 1004, p-doped silicon 1006, and p+-doped silicon 1008. The heavily doped regions 1002 and 1008 provide ohmic contacts for metal electrodes 1010 and 1012. A thin passivation layer (e.g., silicon dioxide) 1016 allows light 1014 to pass into the depletion region that forms between regions 1004 and 1006. A mask layer (e.g., a metal) 1018 blocks light from reaching other electrical components and potentially interfering with their operation.

The depletion region formed between p-doped silicon and n-doped silicon is the product of a natural electric field. As photons of light 814, 914, and 1014 enter a depletion region, the photon energy may be absorbed by electrons, causing the electrons to jump from the valence energy band to the conduction energy band. Such events create charge carriers that are "free". These carriers are swept from the depletion region by the natural electric field. The current flow thus induced is (generally speaking) proportional to the light intensity.

Utilizing the ferroelectric memory of FIG. 7 and any of the photoelectric diodes of FIGS. 8, 9, and 10, an imaging device for high temperature operation may be constructed. Photosensitive diodes (or other photosensitive electronic components) can be arranged in a grid to create an image-sensitive device. FIG. 11 shows a pixel cell 1102 from an illustrative device. Cell 1102 includes a photosensitive diode 1104 that generates a current proportional to the intensity of the incident light 1106. An operational amplifier 1108 is configured as a current-to-voltage amplifier by a feedback resistor 1110. An analog-to-digital converter 1112 samples and digitizes the voltage from operational amplifier 1108, and provides the digital intensity value to a bus interface 1114. Bus interface 1114 couples to a bus 1116 and drives the digital intensity value on the bus 1116 when the interface 1114 is individually addressed. A bus controller (not shown) gathers the digital intensity values and stores them in a memory to form a digital image.

FIG. 12 shows an illustrative solid state camera 1202. Light 1204 passing through an aperture and a lens system 1206 is focused on image sensitive device 1208. Device 1208 includes a grid of pixel cells that detect the light intensity, and a controller that gathers the intensity values into a digital image. As shown, the camera 1202 is a black-and-white camera. However, with prisms or beamsplitters and/or filters, a color camera can also be implemented. Solid state cameras may be employed in a downhole environment for formation imaging.

FIG. 13 shows an illustrative spectrometer 1302. Light 1204 passing through an aperture strikes a dispersive element such as a reflective diffraction grating 1304. Other dispersive elements could be used, including transmissive diffraction gratings and prisms. The diffraction grating 1034 reflects the light at a different angles θ depending on the wavelength λ of the light:

$$\theta = \arcsin\left(\frac{m\lambda}{a}\right),$$

where m is the diffraction order (an integer), and a is the length of the grating period. In any event, light leaving the dispersive element strikes device 1306 at a position that depends on the light's wavelength. A row of pixel cells 1102 on device 1306 can thus measure the spectral composition of the light. A downhole spectrometer would allow for in-situ composition analysis of fluids and formation materials. A high-temperature memory may be used to store spectrometer measurements.

FIG. 14 shows an illustrative block diagram of a high temperature imaging device 1402 such as a spectrometer or camera. The imaging device includes an array 1404 of photosensitive elements, a processor 1406, and an information storage module 1408. Each of the components is configured to operate at high temperature, e.g., in excess of 200° C. An aperture and/or lens system forms an image or other light pattern on array 1404. Array 1404 converts the incident light into electrical values which are captured by processor 1406. Processor 1406 stores digital data in information storage module 1408. The digital data is representative of the image or light pattern detected by array 1404, and may result from processing of data values captured by processor 1406. At appropriate times or in response to commands, processor 1406 may be configured to retrieve data from information storage module 1408 and export the data from device 1402 via an interface (not shown).

Photosensitive elements may be used in stand-alone fashion (i.e., not as part of an array for detecting images or spectra). For example, one or more photosensitive elements may be used as a light detector in a radiation detector. Certain materials (such as sodium iodide) scintillate in the presence of radiation. Photosensitive elements may be used to detect and count such scintillations, thereby deriving a radiation measurement. In another application, one or more photosensitive elements may be used as a fiberoptic receiver. Light-emitting diodes can also be fabricated on a sapphire substrate, allowing implementation of fiberoptic transceivers that allow two-way communication over optical fiber. In yet another application, a photosensitive element may be used to detect the presence, absence, or intensity of a light wavelength in a high temperature environment. This last application may lend itself, among other things, to monitoring fluid types and/or compositions. The intensity of a spectral line may reflect a concentration of some trace material.

Numerous variations and modifications will become apparent to those skilled in the art once the above disclosure is fully appreciated. For example, the disclosed invention embodiments may be applied in elevated temperature environments unrelated to wells, e.g., foundries, refineries, chemical plants, internal combustion (e.g., automotive) engines, aerospace engines, and power generation environments. The teachings herein regarding silicon on sapphire technology are also applicable to silicon on spinel technology, simply by replacing the sapphire substrate with a spinel substrate. It is intended that the following claims be interpreted to embrace all such variations and modifications.

What is claimed is:

1. An imaging device that comprises:
   an array of photosensitive elements fabricated on a spinel substrate; and
   an information storage component fabricated on the spinel substrate and coupled to the array to store digital data representing one or more light patterns detected by the array.

2. The device of claim 1, further comprising:
   a processor coupled to the array and coupled to the information storage component, wherein the processor captures light patterns detected by the array and processes captured light patterns to generate said digital data representing one or more light patterns detected by the array.

3. The device of claim 2, wherein the processor is fabricated on an insulator Substrate.

4. The device of claim 2, wherein the processor is fabricated on the spinel substrate with the array.

5. The device of claim 1, further comprising:
   a light aperture that forms an image on the array of photosensitive elements,
   wherein said one or more light patterns include the image formed by the light aperture on the array.

6. The device of claim 1, further comprising:
   a diffraction grating that forms a spectral pattern on the array of photosensitive elements,
   wherein said one or more light patterns include the spectral pattern formed by the diffraction grating.

7. The device of claim 1, further comprising:
   a prism that forms a spectral pattern on the array of photosensitive elements,
   wherein said one or more light patterns include the spectral pattern formed by the prism.

8. The device of claim 1, further comprising:
   one or more filters that associate particular colors with particular photosensitive elements in the array.

9. The device of claim 1, wherein the information storage device includes a ferroelectric memory.

10. The device of claim 1, wherein the device is operable at temperatures greater than 200 C.

11. An imaging device that comprises:
    an array of photosensitive elements fabricated on a silicon carbide substrate;
    an information storage component coupled to the array to store data representing one or more light patterns detected by the array; and
    a processor coupled to the array and coupled to the information storage component,
    wherein the processor captures light patterns detected by the array and processes captured light patterns to generate said data representing one or more light patterns detected by the array, and
    wherein the processor is fabricated on a silicon carbide substrate.

12. The device of claim 11, wherein the processor is fabricated on the silicon carbide substrate with the array.

13. The device of claim 11, further comprising:
    one or more filters that associate particular colors with particular photosensitive elements in the array.

14. The device of claim 11, wherein the information storage device includes a ferroelectric memory.

15. The device of claim 11, wherein the device is operable at temperatures greater than 200 C.

16. An imaging device that comprises:
    an array of photosensitive elements fabricated on a silicon carbide substrate;
    an information storage component fabricated on the silicon carbide substrate and coupled to the array to store digital data representing one or more light patterns detected by the array; and
    a light aperture that forms an image on the array of photosensitive elements,
    wherein said one or more light patterns include the image formed by the light aperture on the array.

17. An imaging device that comprises:
    an array of photosensitive elements fabricated on a silicon carbide substrate;
    an information storage component fabricated on the silicon carbide substrate and coupled to the array to store digital data representing one or more light patterns detected by the array; and
    a diffraction grating that forms a spectral pattern on the array of photosensitive elements, wherein said one or more light patterns include the spectral pattern formed by the diffraction grating.

18. An imaging device that comprises:
an array of photosensitive elements fabricated on a silicon carbide substrate;
an information storage component coupled to the array to store data representing one or more light patterns detected by the array; and
a prism that forms a spectral pattern on the array of photosensitive elements,
wherein said one or more light patterns include the spectral pattern formed by the prism.

19. An imaging device that comprises:
an array of photosensitive elements fabricated on an insulated silicon (SOI) substrate;
an information storage component coupled to the array to store data representing one or more light patterns detected by the array; and
a dispersive element that forms a spectral pattern on the array of photosensitive elements, wherein the dispersive element includes a prism, and
wherein said one or more light patterns include the spectral pattern formed by the dispersive element.

20. A high temperature imaging method that comprises:
placing an imaging device in a high temperature environment;
receiving light through an aperture; and
forming an image on a photosensitive array operable at temperatures greater than 200 C.

21. The method of claim 20, further comprising:
acquiring values representative of the image from the array; and
storing data derived from the values in a memory operable at temperatures greater than 200 C.

22. The method of claim 21, wherein the memory is a ferroelectric memory.

23. The method of claim 20, wherein the high temperature environment is a well bore.

24. The method of claim 20, wherein the photosensitive array is manufactured on a sapphire or spinel substrate.

25. The method of claim 20, wherein the photosensitive array is manufactured on a silicon carbide substrate.

26. The method of claim 20, wherein the photosensitive array is manufactured on an insulated silicon wafer.

27. A high-temperature monitoring method that comprises:
measuring a spectral composition of incident light with at least one photosensitive element fabricated on a spinel substrate; and
processing a signal from the at least one photosensitive element to provide an indication of a material's presence.

28. The method of claim 27, wherein the indication represents a concentration of the material.

29. The method of claim 27, wherein the method further comprises:
placing a tool containing the substrate in a well bore.

* * * * *